United States Patent [19]

Kurby

[11] 4,449,250

[45] May 15, 1984

[54] RADIO-FREQUENCY SYNTHESIZER FOR DUPLEX RADIOS

[75] Inventor: Christopher N. Kurby, Elmhurst, Ill.

[73] Assignee: Motorola, Inc., Schaumburg, Ill.

[21] Appl. No.: 332,432

[22] Filed: Dec. 21, 1981

[51] Int. Cl.³ .................... H04B 1/40; H04L 7/18; H03C 3/00

[52] U.S. Cl. .................... 455/76; 455/113; 332/18; 332/19; 331/1 A; 331/17; 331/25

[58] Field of Search .............. 455/76, 77, 78, 183, 455/113; 331/1 A, 17, 25, 16, 22, 31; 332/18, 19; 370/24, 32

[56] References Cited

U.S. PATENT DOCUMENTS

4,086,545  4/1978  Teshirogi .......................... 455/76

FOREIGN PATENT DOCUMENTS

54-127209  10/1979  Japan .......................... 455/76
54-154211  12/1979  Japan .......................... 455/76

OTHER PUBLICATIONS

"Using PLL for CB Freq. Synthesizers" by Scott, Radio Electronics, vol. 48, No. 4, Apr. 1977.

Primary Examiner—Jin F. Ng
Attorney, Agent, or Firm—Rolland R. Hackbart; James W. Gillman

[57] ABSTRACT

An improved frequency sythesizer for duplex radios is described that includes a phase-locked loop coupled to a reference oscillator for developing a transmit carrier signal. The phase-locked loop includes a phase comparator, loop filter and voltage controlled oscillator in a forward path for generating a transmit and receive injection signal. A first mixer mixes the injection signal and an offset signal from an offset oscillator to generate the transmit carrier signal. A divider divides the transmit carrier signal by the pre-selected number to generate a feedback signal which is also coupled to the phase comparator. A second mixer mixes the injection signal with a receive carrier signal to generate an intermediate frequency signal, which is coupled to a receiver and demodulated. A duplexer couples the transmit carrier signal to an antenna and also couples the receive carrier signal from the antenna. Two techniques are described for modulating the transmit carrier signal with information signals, such as voice, tone, or data signals. According to one technique, both the reference oscillator and the offset oscillator are modulated. Since the modulations are cancelled by the phase detector, the injection signal is not modulated. According to the other technique, only the offset oscillator is modulated. Modulation of the error signal is cancelled by combining it in a summer with the integrated information signal provided by an integrator. The second modulation technique may be utilized when it is desired to lock the phase-locked loop to an external reference signal or when the reference oscillator cannot be modulated.

12 Claims, 2 Drawing Figures

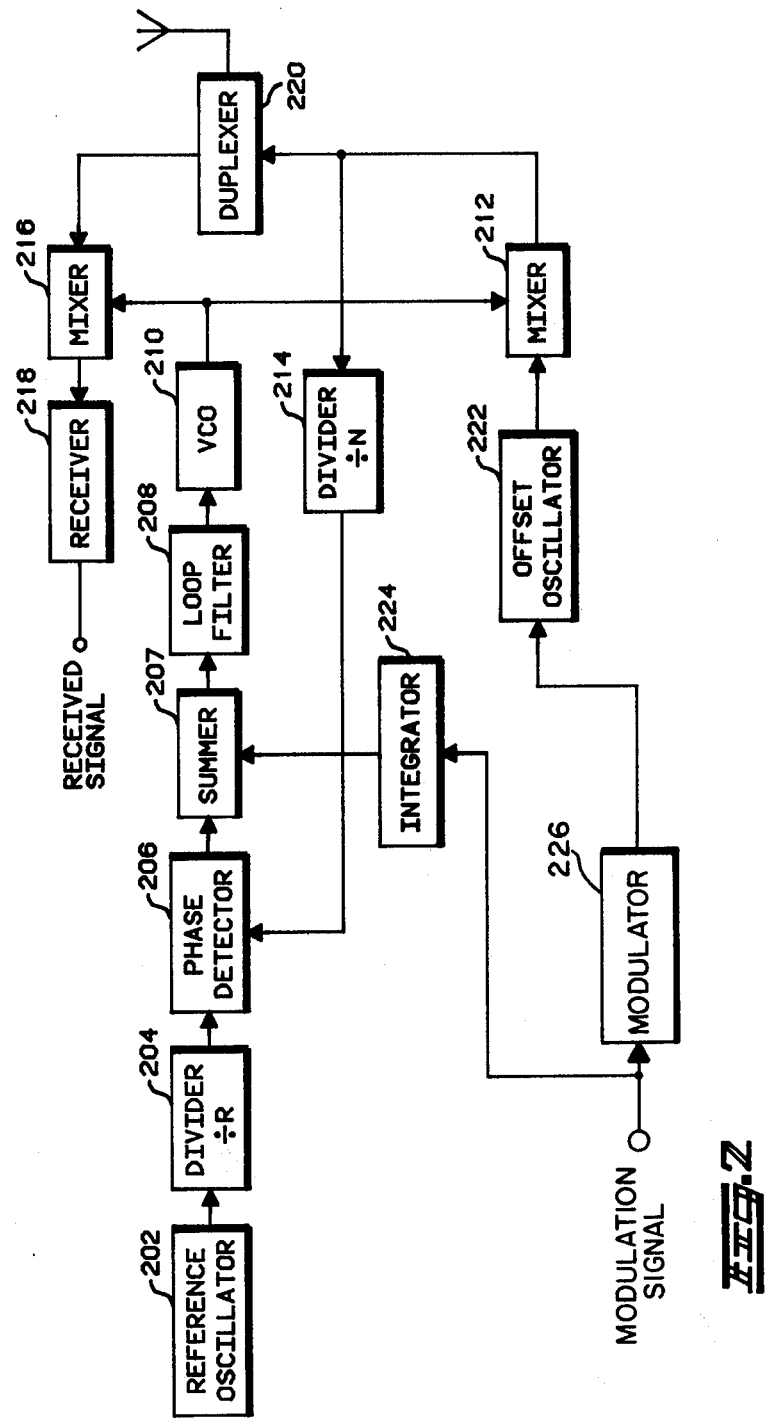

RADIO-FREQUENCY SYNTHESIZER FOR DUPLEX RADIOS

BACKGROUND OF THE INVENTION

The present invention relates generally to radio-frequency (RF) synthesizers, and more particularly to RF synthesizers for duplex radios.

In duplex radios, information signals, including voice, tone or data signals, may be simultaneously transmitted and received. Duplex operation is achieved in radios by utilizing two RF carrier signals having frequencies separated by a preselected frequency spacing. For example, in the 450-470 mHz frequency band, the transmit carrier signal has a frequency that is spaced 5 mHz from the receive carrier frequency. Conventional mobile radios exhibiting duplex operation are described in Motorola Instruction Manual Numbers 68P81020E10, 68P81029E65 and 68P81039E25. These Motorola Instruction Manuals and the others referenced hereinbelow may be obtained from Motorola Service Publications Department, Motorola, Inc., 1301 East Algonquin Road, Schaumburg, Ill.

In conventional duplex radios, a frequency synthesizer has been used to generate receive and transmit injection signals. The receive injection signal may be coupled to a mixer for combination with the receive carrier signal for developing an intermediate frequency signal, which may then be demodulated to recover information signals modulated on the receive carrier signal. The transmit injection signal is typically coupled to a mixer for combination with an offset signal provided by a separate oscillator for generating the transmit carrier signal. The transmit carrier signal can be modulated with information signals by modulating the offset oscillator. Radios including this type of offset oscillator are described in U.S. Pat. No. 3,825,830 and in the aforementioned Motorola instruction manual No. 68P81029E65.

Since the transmit carrier signal is developed by mixing the transmit injection signal with the offset signal, the frequency stability of the transmit carrier signal is affected by both the frequency stability of the transmit injection signal and the frequency stability of the offset oscillator. In order to meet Federal Communications Commission regulations on the frequency stability for the transmit carrier signal, relatively high stability oscillators must be used for both the reference oscillator of the frequency synthesizer and the offset oscillator. Such high stability oscillators are relatively expensive. Furthermore, the cost of these high frequency stability oscillators increases as their frequency of operation increases. Moreover, the frequency stability regulations of the Federal Communications Commission are stricter as the frequency of operation is increased. Thus, relatively expensive oscillators are required for radios having carrier frequencies in the 400 mHz frequency range and in the new 800 mHz frequency range.

SUMMARY OF THE INVENTION

Accordingly, it is an object of the present invention to provide an improved and relatively inexpensive radio frequency synthesizer for duplex radios.

It is another object of the present invention to provide an improved radio frequency synthesizer for duplex radios that can be readily adapted to accommodate any desired frequency spacing between the transmit carrier signal and the receive carrier signal.

It is yet another object of the present invention to provide an improved radio frequency synthesizer for duplex radios that develops a transmit carrier signal with a relatively high frequency stability and a receive injection signal with a somewhat lower frequency stability.

It is yet a further object of the present invention to provide an improved radio frequency synthesizer for duplex radios that develops a transmit carrier signal with a relatively high frequency stability that can be modulated by information signals having a frequency range in excess of the frequency band extending from 0.375 Hz to 12 kHz.

In an embodiment of the present invention, frequency synthesizing circuitry includes a phase-locked loop coupled to a reference signal from a reference oscillator for developing a carrier signal. The phase-locked loop includes a phase comparator, loop filter and voltage-controlled oscillator in a forward path for generating an injection signal. The injection signal and an offset signal from an offset oscillator are coupled to a mixer, which mixes them to generate the carrier signal. A divider divides the carrier signal by a pre-selected number to generate a feedback signal which is also coupled to the phase comparator. Since the carrier signal is phase locked to the reference signal, the frequency stability of the carrier signal is determined solely by the frequency stability of the reference oscillator.

BRIEF DESCRIPTION OF THE DRAWINGS

FIG. 2 is a block diagram of another duplex radio transceiver including a radio frequency synthesizer embodying the present invention.

DETAILED DESCRIPTION OF THE PREFERRED EMBODIMENTS

Figure 1:
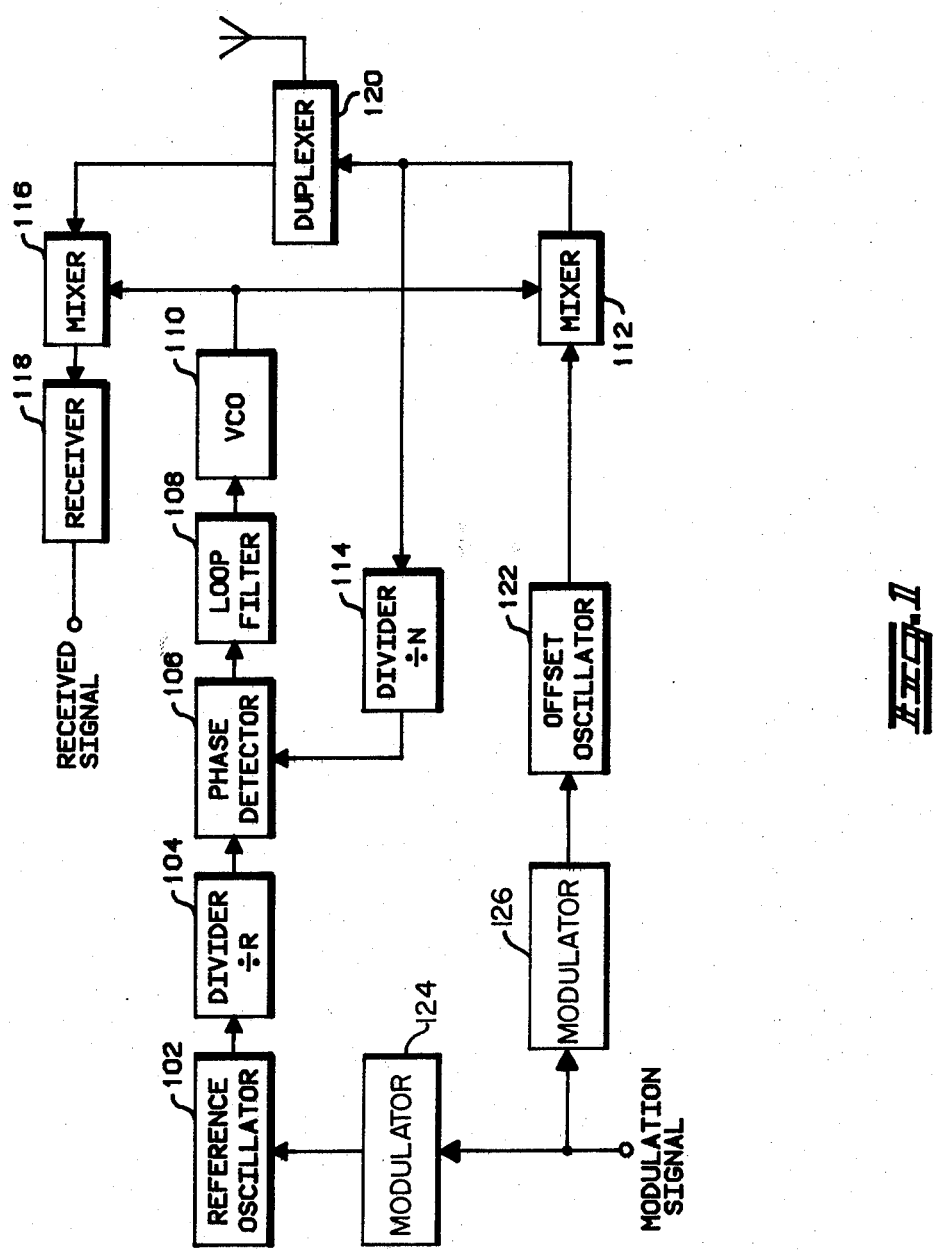
FIG. 1 is a block diagram of a duplex radio transceiver including a radio frequency synthesizer embodying the present invention.

In FIG. 1, there is illustrated a duplex radio transceiver embodying the improved radio frequency synthesizer of the present invention, that is particularly well suited for use in frequency-modulated (FM) radios. For example, the duplex radio transceiver in FIG. 1 can be advantageously utilized in the duplex FM mobile radios described in the aforementioned Motorola Instruction Manuals and in the FM base station radios described in Motorola Instruction Manual Numbers 68P81013E65, 68P81025E50 and 68P81025E60. Furthermore, the improved radio frequency synthesizer of the present invention may also be adapted for use in amplitude-modulated radios.

The radio transceiver in FIG. 1 includes a duplexer 120 that couples a transmit carrier signal from mixer 112 to an antenna and selectively couples a receive carrier signal from the antenna to mixer 116. Duplexer 120 may be of the type described in U.S. Pat. No. 3,728,731 and is utilized to selectively pass the transmit and receive carrier signals between mixers 112 and 116 and the antenna, respectively. If separate antennas are utilized, duplexer 120 may be replaced by individual filters between mixers 112 and 116 and their respective antennas.

The radio transceiver in FIG. 1 includes an improved frequency synthesizer that phase and frequency locks the transmit carrier signal from mixer 112 to a reference signal from reference oscillator 102. The reference signal from reference oscillator 102 is coupled to divider 104 and divided by a pre-selected number R. The value of the number R is related to the frequency spacing between adjacent transmit carrier or receive carrier channels. Divider 104 may be a programmable divider that is programmed to different divider numbers R by means of control signals (not shown).

The divided reference signal from divider 104 is coupled to a phase-locked loop comprised of blocks 106, 108, 110, 112 and 114. Phase detector 106 compares the divided reference signal from divider 104 to a feedback signal from divider 114 and generates an error signal that is coupled to loop filter 108. Loop filter 108 may typically be a low-pass filter that provides a loop natural frequency of approximately 15 Hz. Thus, loop filter 108 only passes low frequency components of the error signal from phase detector 106. The filtered error signal from loop filter 108 is coupled to the control input of voltage controlled oscillator (VCO) 110. The output of VCO 110 is the receive and transmit injection signal, which is coupled to mixers 112 and 116. The frequency of the injection signal is varied by VCO 110 in response to variations in the magnitude of the filtered error signal from loop filter 108.

The injection signal from VCO 110 is mixed with an offset signal from offset oscillator 122 by mixer 112 for generating the transmit carrier signal. The transmit carrier signal is coupled to divider 114 and divided by a pre-selected ʻnumber N for generating the feedback signal. The value of the divider number N is selected to provide the desired frequency of the transmit carrier signal. As in the case of divider 104, divider 114 may be a programmable divider that is programmed to different divider numbers N by means of control signals (not shown). The operation of the phase-locked loop and selection of divider numbers R and N is described in further detail in my co-pending patent application, Ser. No. 280,156, entitled "Modulating Circuitry for Frequency Modulated Transmitters", filed on July 2, 1981 and assigned to the instant asignee.

The injection signal from VCO 110 is also coupled to mixer 116, where the injection signal is mixed with the receive carrier signal from duplexer 120 for generating an intermediate frequency (IF) signal. The IF signal from mixer 116 may then be coupled to receiver 118, which may typically include an IF filter, IF amplifier and a discriminator for demodulating the information signals modulated on the receive carrier signal. The demodulated information signals from receiver 118 may then be coupled to an audio amplifier and speaker or other circuitry depending on the particular application of the present invention.

According to an important feature of the present invention, the transmit carrier signal from mixer 112 is phase and frequency locked to the divided reference signal from divider 104. Therefore, the frequency stability of the transmit carrier signal is dependent solely upon the frequency stability of reference oscillator 102. For example, if the frequency stability of reference oscillator 102 is two parts-per-million (PPM), the frequency stability of the transmit carrier signal will likewise be two PPM. In prior art duplex radios of the type including an offset oscillator for developing the transmit carrier signal, the maximum frequency variation of the transmit carrier signal is determined by summing the maximum frequency variation of both the reference oscillator and the offset oscillator. In other words, the frequency of the transmit carrier signal varies in response to the sum of the variation in frequency of both the reference oscillator and the offset oscillator in such prior art duplex radios. In contrast, by utilizing the frequency synthesizer of the present invention, the frequency of the transmit carrier signal varies only in response to the frequency variation of reference oscillator 102. Therefore, in a frequency synthesizer embodying the present invention, the frequency stability of the transmit carrier signal will be substantially the same as the frequency stability of reference oscillator 102. As a result, less expensive reference oscillators 102 are required for developing a transmit carrier signal in the 400 mHz frequency range and in the new 800 mHz frequency range.

Although the regulations of the Federal Communications Commission require that a transmit carrier signal have a relatively high frequency stability, there are no regulations on the frequency stability of the receive injection signal. For example, for base station radios operating in the 450–470 mHz frequency band, the frequency stability of the transmit carrier signal must be greater than 2.5 PPM. The frequency synthesizer of the present invention can take advantage of the fact that the frequency stability of the receive injection signal is less than the frequency stability of the transmit carrier signal by allowing the use of a lower frequency stability and therefore less expensive offset oscillator 122. The frequency variation of the injection signal from VCO 110 is the sum of the frequency variation of reference oscillator 102 and offset oscillator 122. For example, let the transmit carrier signal have a frequency of 450 mHz, the receive carrier signal have a frequency of 455 mHz, the offset oscillator have a frequency of 15.7 mHz and a frequency stability of 15 PPM, and the reference oscillator have a frequency of 14.4 mHz and a frequency stability of 2.5 PPM. Divider number R is 2304 and divider number N is 72,000. In this case, the transmit carrier signal will have a frequency stability of 2.5 PPM. Assuming the IF signal from mixer 116 has a frequency of 10.7 mHz, the injection signal from VCO 110 has a frequency of 465.7 mHz. The maximum variation of the injection signal from VCO 110 is approximately the sum of the maximum frequency variation of the reference oscillator which is 1164 Hz and the maximum variation of the offset oscillator which is 235.5 Hz. Thus, the injection signal from VCO 110 has a frequency stability of approximately 3 PPM. Thus, by utilizing the frequency synthesizer of the present invention, it is not necessary that both reference oscillator 102 and offset oscillator 122 have a relatively high frequency stability in order to develop a transmit carrier signal that meets the frequency stability requirements set by the Federal Communications Commission.

Modulation of the transmit carrier signal by information signals, including voice, tone or data signals, may be accomplished by modulating both reference oscillator 102 and offset oscillator 122 by means of modulators 124 and 126, respectively, as shown in FIG. 1, or by modulating offset oscillator 222 by means of modulator 226 and coupling the information signals to integrator 222, whose output is coupled to summer 207 for combination with the error signal from phase detector 206, as shown in FIG. 2. Both of these modulation schemes are suitable for use in the FM mobile radios and FM base stations described in the aforementioned Motorola Instruction Manuals. Also, conventional circuits for modulatable oscillators are described in U.S. Pat. Nos. 3,581,239, 3,581,240 and 3,916,344.

The modulation scheme illustrated in FIG. 2 is also suitable for those applications where reference oscillator 202 may not be directly modulated or where the reference signal is provided by an external reference signal source. In some radio systems, such as the simulcast system described in U.S. Pat. No. 4,188,582, it is necessary that a number of geographically separated transmitters be frequency and phase synchronized to a common reference signal. The radio transceiver illustrated in FIG. 2 may be advantageously utilized in the transceivers of such a simulcast system by coupling the common reference signal to divider 204.

According to another important feature of the present invention, the modulation applied to the transmit carrier signal is cancelled out by phase detector 106 in FIG. 1 and by summer 207 in FIG. 2 so that the injection signal from VCO 110 and 210 is not modulated by the information signal. Thus, as in FIG. 1, if both reference oscillator 102 and the transmit carrier signal are modulated by the information signal, the modulation will be essentially cancelled by phase detector 106. In FIG. 2, modulation of the error signal from phase detector 206 is essentially cancelled in summer 207 by the output of integrator 224. Integrator 224 integrates the information signal to provide an output that is essentially the same as the modulated error signal from phase detector 206. Summer 207 combines the output from integrator 224 with the error signal, thereby cancelling the affects on the error signal due to the modulation of the transmit carrier signal. To provide good cancellation in summer 207, the output of integrator 224 is scaled by a factor of $-K$ if the frequency of the injection signal is greater than the frequency of the transmit carrier signal and by a factor of $+K$ if the frequency of the injection signal is less than the frequency of the transmit carrier signal. Similarly, the information signal applied to reference oscillator 102 in FIG. 1 is scaled by a factor of $-K$ or $+K$ to provide good cancellation of the modulation in phase detector 106. In addition, any modulation components that are not completely cancelled will be further attentuated by the low-pass response characteristics of loop filter 108 and 208. Emperical results demonstrate that cancellation in excess of 20 dB can readily be obtained.

In summary, an improved frequency synthesizer for duplex radios has been described that develops a transmit carrier signal with a relatively high frequency stability and a receive injection signal with a somewhat lower frequency stability. As a result, less expensive oscillators can be used for the reference oscillator and offset oscillation in the improved frequency synthesizer. Furthermore, the transmit carrier signal can be modulated by information signals, such as voice, tone, or data signals, having frequencies extending from 0.375 Hz to 12 kHz.

I claim:

1. Frequency synthesizing circuitry comprising:
   means for generating a reference signal having a predetermined frequency;
   means for comparing the phase of the reference signal to the phase of a feedback signal and generating an error signal;
   means for filtering the error signal;
   voltage controlled oscillator (VCO) means for generating an output signal having a frequency varying with the filtered error signal;
   means for generating an offset signal having a predetermined frequency;
   means for mixing the VCO output signal and the offset signal and generating a carrier signal having a frequency that is substantially the sum or difference of the frequency of the VCO output signal and the frequency of the offset signal;
   means for frequency dividing the carrier signal by a pre-selected number to generate the feedback signal;
   a signal source for providing an information signal;
   means for modulating the frequency of the reference signal with the information signal; and
   means for modulating the frequency of the offset signal with the information signal, whereby the modulation of the feedback signal is substantially cancelled by the modulation of the reference signal.

2. The frequency synthesizing circuitry according to claim 1, further including means interposed between the reference signal generating means and the phase comparing means for frequency dividing the reference signal by a pre-selected number.

3. Frequency synthesizing circuitry comprising:
   means for generating a reference signal having a predetermined frequency;
   means for comparing the phase of the reference signal to the phase of a feedback signal and generating an error signal;
   means for filtering the error signal;
   voltage controlled oscillator (VCO) means for generating an output signal having a frequency varying with the filtered error signal;
   means for generating an offset signal having a predetermined frequency;
   means for mixing the VCO output signal and the offset signal and generating a carrier signal having a frequency that is substantially the sum or difference of the frequency of the VCO output signal and the frequency of the offset signal;
   means for frequency dividing the carrier signal by a pre-selected number to generate the feedback signal;
   a signal source for providing an information signal;
   means for modulating the frequency of the offset signal with the information signal;
   means for integrating the information signal; and
   means interposed between the phase comparing means and the filtering means for summing the error signal and the integrated information signal, whereby the modulation of the error signal is substantially cancelled by the integrated information signal.

4. The frequency synthesizing circuitry according to claim 3, further including means interposed between the reference signal generating means and the phase comparing means for frequency dividing the reference signal by a pre-selected number.

5. Circuitry for synthesizing the frequency of a transmit carrier signal of a duplex radio transceiver, said frequency synthesizing circuitry comprising:
   means for generating a reference signal having a predetermined frequency;
   means for comparing the phase of the reference signal to the phase of a feedback signal and generating an error signal;
   means for filtering the error signal;
   voltage controlled oscillator (VCO) means for generating an injection signal having a frequency varying with the filtered error signal;

means for generating an offset signal having a predetermined frequency;

means for mixing the injection signal and the offset signal and generating the transmit carrier signal having a frequency that is substantially the sum or difference of the frequency of the injection signal and the frequency of the offset signal;

means for frequency dividing the transmit carrier signal by a pre-selected number to generate the feedback signal;

a signal source for providing an information signal;

means for modulating the frequency of the reference signal with the information signal; and means for modulating the frequency of the offset signal with the information signal, whereby the modulation of the feedback signal is substantially cancelled by the modulation of the reference signal.

6. The frequency synthesizing circuitry according to claim 5, further including means interposed between the reference signal generating means and the phase comparing means for frequency dividing the reference signal by a pre-selected number.

7. The frequency synthesizing circuitry according to claim 6, further including antenna means for receiving and transmitting signals, duplexing means for selectively coupling the transmit carrier signal to the antenna means and for selectively coupling a receive carrier signal from the antenna means, and means for mixing the receive carrier signal and the injection signal and generating an intermediate frequency signal having a frequency that is substantially the sum or difference of the frequency of the receive carrier signal and the injection signal.

8. The frequency synthesizing circuitry according to claim 7, wherein the receive carrier signal is modulated with an information signal, said frequency synthesizing circuitry further including receiving means coupled to the intermediate frequency signal for receiving the information signal modulated thereon.

9. Circuitry for synthesizing the frequency of a transmit carrier signal of a duplex radio transceiver, said frequency synthesizing circuitry comprising:

means for generating a reference signal having a predetermined frequency;

means for comparing the phase of the reference signal to the phase of a feedback signal and generating an error signal;

means for filtering the error signal;

voltage controlled oscillator (VCO) means for generating an injection signal having a frequency varying with the filtered error signal;

means for generating an offset signal having a predetermined frequency;

means for mixing the injection signal and the offset signal and generating the transmit carrier signal having a frequency that is substantially the sum or difference of the frequency of the injection signal and the frequency of the offset signal;

means for frequency dividing the transmit carrier signal by a pre-selected number to generate the feedback signal;

a signal source for providing an information signal;

means for modulating the frequency of the offset signal with the information signal;

means for integrating the information signal; and means interposed between the phase comparing means and the filtering means for summing the error signal and the integrated information signal, whereby the modulation of the error signal is substantially cancelled by the integrated information signal.

10. The frequency synthesizing circuitry according to claim 9, further including means interposed between the reference signal generating means and the phase comparing means for frequency dividing the reference signal by a pre-selected number.

11. The frequency synthesizing circuitry according to claim 10, further including antenna means for receiving and transmitting signals, duplexing means for selectively coupling the transmit carrier signal to the antenna means and for selectively coupling a receive carrier signal from the antenna means, and means for mixing the receive carrier signal and the injection signal and generating an intermediate frequency signal having a frequency that is substantially the sum or difference of the frequency of the receive carrier signal and the injection signal.

12. The frequency synthesizing circuitry according to claim 11, wherein the receive carrier signal is modulated with an information signal, said frequency synthesizing circuitry further including receiving means coupled to the intermediate frequency signal for receiving the information signal modulated thereon.

* * * * *